(12) United States Patent
Abe

(10) Patent No.: US 6,323,848 B1
(45) Date of Patent: *Nov. 27, 2001

(54) LIQUID CRYSTAL DISPLAY DRIVING SEMICONDUCTOR DEVICE

(75) Inventor: Katsumi Abe, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/148,117

(22) Filed: Sep. 4, 1998

(30) Foreign Application Priority Data

Sep. 11, 1997 (JP) .................................................... 9-246743

(51) Int. Cl.[7] .................................................... G09G 5/00
(52) U.S. Cl. ............................................................. 345/204
(58) Field of Search ..................... 345/204, 96, 99, 345/87, 88, 89

(56) References Cited

U.S. PATENT DOCUMENTS 6,023,131 * 2/2000 Okita ...................................... 345/204
6,025,835 * 2/2000 Aoki et al. ............................ 345/204
6,043,812 * 3/2000 Utsunomiya et al. ................ 345/204

FOREIGN PATENT DOCUMENTS 64-34019    2/1989    (JP) .

* cited by examiner

Primary Examiner—Richard Hjerpe
Assistant Examiner—Ronald Laneau
(74) Attorney, Agent, or Firm—McGinn & Gibb, PLLC

(57) ABSTRACT

The present invention has the object of reducing the resetting time within a circuit and achieves this object by isolating an operational amplifier from the entire circuit by switches when resetting and then reconnecting the operational amplifier to the circuit to obtain a desired output after completing the resetting operation. The resetting operation is thus carried out with the operational amplifier in an isolated state from the entire circuit, thereby allowing the resetting time to be set independent of the time required for stabilization of the output of the operational amplifier. The resetting time can thus be made shorter than in an example of the prior art and the actual driving time can be increased when the output is used to drive a liquid crystal.

19 Claims, 2 Drawing Sheets

LIQUID CRYSTAL DISPLAY DRIVING SEMICONDUCTOR DEVICE

BACKGROUND OF THE INVENTION

1. Field of the Invention

The present invention relates to a driver circuit that outputs a drive signal, and particularly to a liquid crystal display driving semiconductor device for driving a liquid crystal.

2. Description of the Related Art

TFT(Thin-Film Transistor) active-matrix liquid crystal display devices that realize display by incorporating address TFTs in matrix form within liquid crystal panel are currently the mainstream in matrix liquid crystal display devices. Source drivers that send image signals and gate drivers that send scanning signals for effecting line sequential scanning are used to drive TFT active-matrix liquid crystal display devices.

A gate driver is a device that impresses voltage to the gate electrodes of TFTs in accordance with timing signals for row electrode scanning that are generated from image signals in a signal conversion circuit. Assuming that one horizontal interval (scanning interval) is H, a gate driver impresses for every row a scanning signal having a pulse width of H to the scanning electrodes, and sets TFTs on the panel to a sequential ON state for every row. Here, it is assumed that one horizontal interval (scanning interval) H is equal to T/N if T is one frame (all scanning intervals) of row electrodes and N is the number of row electrodes. Image signals are converted by the signal conversion circuit and γ-correction circuit to alternating-current driving signals that accord with the voltage-transmittance ratio characteristic of a liquid crystal and are impressed to liquid crystals by way of TFTS that have been turned ON by a source driver. Voltage suitable for the liquid crystals of all pixels can be impressed by repeating this operation for all row electrodes.

The time interval for repeating the above-described operation for all rows is one frame. However, one frame interval T must be a time interval in which a user cannot perceive line sequential scanning, and one horizontal interval H must be made longer than the time interval in which the voltage across the capacitance of the liquid crystal becomes the voltage impressed by the source driver.

Gray-level display in a TFT active-matrix liquid crystal display device is realized by varying the voltage impressed to the liquid crystal. The transmittance of light varies according to the voltage impressed to the liquid crystal due to the upper and lower polarizers and the electrical optical characteristics of a liquid crystal sandwiched between these polarizers. The brightness (tone) of light that is transmitted from the backlight behind a liquid crystal panel and through the liquid crystal panel is therefore determined by the voltage impressed to the liquid crystal.

Recent years have seen the development of color (multi-tone) and high-definition TFT active-matrix liquid crystal display devices.

In accordance with the voltage-transmittance characteristics of a liquid crystal, transmittance varies widely with slight changes in voltage if transmittance is at a medium level. To realize multi-tone displays, voltage must be impressed to the liquid crystal layer at high accuracy so that the liquid crystal has the desired transmittance.

The offset voltage of operational amplifiers used in the output of source drivers exhibits a spread of several mV even on the same chip. When displaying the same tone on a panel, the occurrence of any variation in the offset voltage of each operational amplifier within a source driver that impresses voltage to each pixel according to the voltage-transmittance characteristic of the liquid crystal will give rise to discrepancies in the transmittance of the liquid crystal because the voltage that is impressed varies between pixels to the extent of the offset voltage. In cases of a large number of tones, slight discrepancies in the transmittance of the liquid crystals are manifested as discrepancies in the tones of the display device, thereby degrading the quality of the display device. Multi-tone displays therefore require a degree of accuracy such that offset voltage can be ignored.

The circuit of a switched capacitor D/A(digital-to-analog) converter that is shown in FIG. 1 is made up of: V1 and V2 as analog input and reference voltage Vr; operational amplifier D1 having its positive input terminal connected to reference power supply voltage Vr; capacitor C1 provided with a capacitance of nC and capacitor C2 provided with a capacitance of (α−n)C, the two capacitors C1 and C2 being connected in parallel between the negative input terminal of operational amplifier D1 and power supplies V1 and V2, respectively; capacitor C3 provided with a capacitance of αC and connected between the negative input terminal and the output terminal of operational amplifier D1; switch SW1 provided between power supply V1 and the side of capacitor C1 that is not connected to operational amplifier D1; switches SW2 and SW3 connected in a series between V2 and the side of capacitor C1 that is not connected to operational amplifier D1; switch SW4 provided between the side of switch SW2 that is not connected to V2 and the positive input terminal of operational amplifier D1; switch SW8 provided between the negative input terminal and output terminal of operational amplifier D1 and in parallel with capacitor C3; and switch SW9 connected to the output terminal of operational amplifier D1 for cutting off the connection with an external load (not shown in the figure). In addition, capacitor C2 is connected to V2 by way of switch SW2.

Explanation is next presented regarding the operation of the circuit configured according to the description above.

Switch SW9 is first set in the OFF state to isolate this circuit from external load (not shown), such that the circuit is not subject to influence from the outside in the resetting operation.

Next, switches SW1 and SW2 are set to an OFF state, and switches SW3, SW4, and SW8 are each set to the ON state, whereupon operational amplifier D1 functions as a voltage follower and ideally, the potential at the negative input terminal of operational amplifier D1 becomes equal to the voltage Vr at the positive input terminal, thereby effecting resetting of the circuit.

After resetting has been completed, switches SW1 and SW2 are set to an ON state, switches SW3, SW4 and SW8 are set to an OFF state, and the output preparation operation Vout=2 Vr−V2−n (V1−V2)/α to the exterior, which is the output of the circuit, is carried out.

When switch SW9 is subsequently set to an ON state, the above-described output preparation Vout=2Vr−V2−n (V1−V2)/α is outputted to the exterior, and is applied to external load.

The operational amplifier is made to function as a voltage follower when resetting in the above-described device of the prior art, and carrying out a resetting operation in this way may easily bring about ringing in response to the light load in the circuit.

In the above-described prior-art circuit, there is an interval of 2–3 μs from the start of the resetting operation until stabilization of the potential at the negative input terminal of the operational amplifier, as shown in FIG. 2.

With the development of larger sizes and higher definition in liquid crystal display devices in recent years, there has been a growing demand for a shorter time interval for driving the liquid crystal.

When a device that requires a time interval of 2–3 μs for resetting is used in a large-scale or high-definition liquid crystal display device, the drive time for an element ends before the potential stabilizes, and the desired voltage therefore cannot be applied to the liquid crystal. This failure raises the concern that the resulting display will differ from the intended display.

SUMMARY OF THE INVENTION

The object of the present invention is to provide a driver circuit, a liquid crystal driving semiconductor device, as well as a drive method that can shorten the resetting time within a circuit.

In this invention, an operational amplifier is isolated from the entire circuit by switching means when carrying out resetting. And then the operational amplifier is reconnected to the circuit after resetting is completed and a desired output is obtained.

Resetting is thus effected with the operational amplifier isolated from the entire circuit and the resetting time is set independent of the time necessary for the output of the operational amplifier to stabilize, thereby shortening the resetting time compared with the prior art and lengthening the essential driving time when this output drives a liquid crystal.

Drive is thus enabled for liquid crystals that could not be effectively driven in the prior art.

When a switching means is connected to the output terminal of an operational amplifier, moreover, the load applied to the operational amplifier increases and ringing is therefore suppressed.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

An embodiment of the present invention is explained hereinbelow with reference to the accompanying figures.

Figure 1:
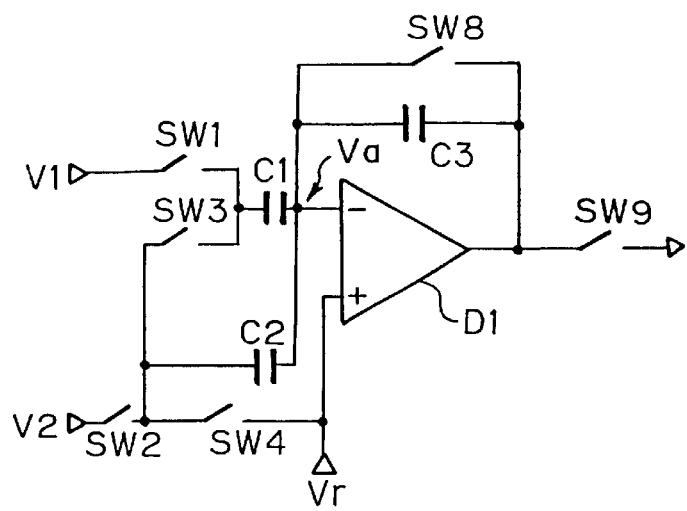
FIG. 1 is a circuit diagram showing one example of the construction of a liquid crystal driving semiconductor device of the prior art.
Figure 2:
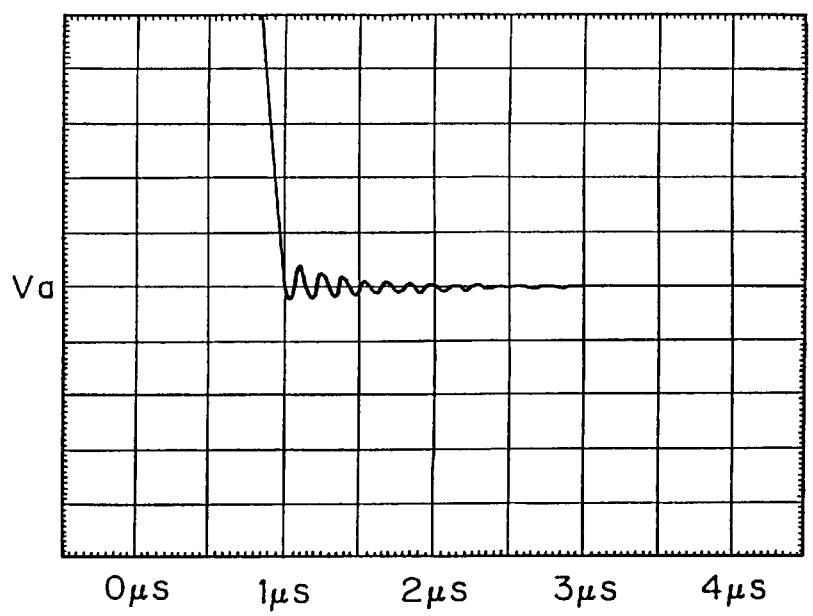
FIG. 2 shows the change in potential at the negative input terminal of an operational amplifier during resetting in the circuit shown in FIG. 1.
Figure 3:
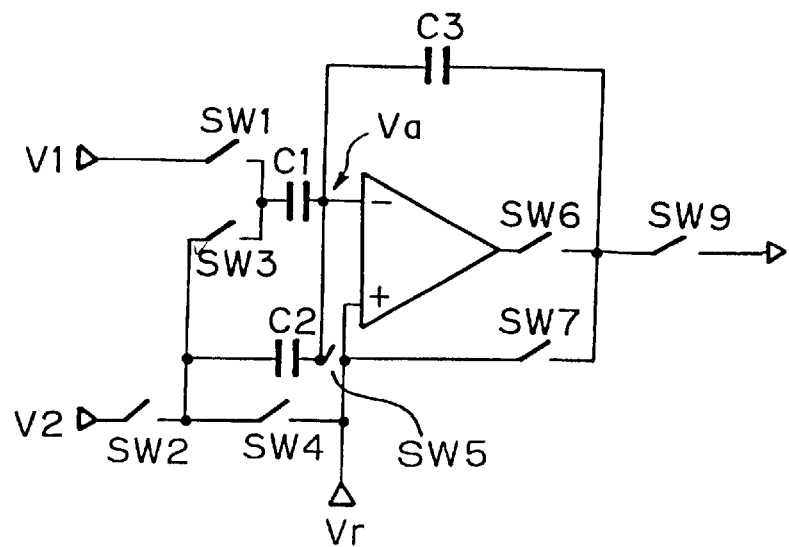
FIG. 3 is a circuit diagram showing one embodiment of the liquid crystal driving semiconductor device according to the present invention.

As shown in FIG. 3, this embodiment is made up of: first power supply V1 and second power supply V2 as analog inputs and reference power supply voltage Vr; operational amplifier D1 having its positive input terminal connected to reference power supply voltage Vr; first capacitor C1 provided with a capacitance of nC connected between the negative input terminal of operational amplifier D1 and V1; second capacitor C2 provided with a capacitance of (α−n)C connected between the negative input terminal of operational amplifier D1 and V2; third capacitor C3 provided with a capacitance of αC connected between the negative input terminal and the output terminal of operational amplifier D1; switch SW1 which is a first switching means provided between V1 and the side of capacitor C1 that is not connected to operational amplifier D1; switch SW2 which is a second switching means provided between V2 and the side of capacitor C2 that is not connected to operational amplifier D1; switch SW3 which is a third switching means for connecting the side of capacitor C1 that is not connected to operational amplifier D1 with the side of capacitor C2 that is not connected to operational amplifier D1; switch SW4 which is a fourth switching means for connecting the side of switch SW2 not connected to V2 and the positive input terminal of operational amplifier D1; switch SW5 which is a fifth switching means provided between the side of capacitor C2 that is connected to operational amplifier D1 and the positive input terminal of operational amplifier D1; switch SW6 which is a sixth switching means provided between the output terminal of operational amplifier D1 and the side of capacitor C3 that is not connected to the negative input terminal of operational amplifier D1; switch SW7 which is a seventh switching means for connecting the positive input terminal and output terminal of operational amplifier D1; and switch SW9 which is connected to the output terminal of operational amplifier D1 through SW6 and which cuts off the connection with an external load (not shown in the figure).

The operation of the circuit constructed according to the foregoing description is explained hereinbelow.

The circuit is first reset, and for this operation, switches SW6 and SW9 are first set in an OFF state, whereby operational amplifier D1 is isolated from the entire circuit and the output of operational amplifier D1 exerts no influence in the resetting operation and, in addition, this circuit and external load (not shown) are isolated such that no influence is exerted from the outside in the resetting operation.

Switches SW1 and SW2 are next set in an OFF state, and switches SW3–SW5 and SW7 are each set in an ON state, whereupon both terminals of each of capacitors C1–C3 are fixed at reference power supply voltage Vr and capacitance is forcibly reset.

Upon completion of the resetting operation, switches SW3–SW5 and SW7 are each set in an OFF state and switches SW1 and SW2 are set in an ON state, whereby the potential of power supply V1 is impressed to capacitor C1, the potential of power supply V2 is impressed to capacitor C2, and the output preparation of the circuit is carried out.

Switches SW6 and SW9 are then set to an ON state, thereby outputting Vout=2Vr−V2−n(V1−V2)/α as the circuit output, and this is applied to the external load.

In this embodiment, operational amplifier D1 is placed in an isolated state from the entire circuit by switch SW6 when carrying out resetting, and the resetting time can therefore be set independent of the time required for stabilization of the output of operational amplifier D1.

Figure 4:
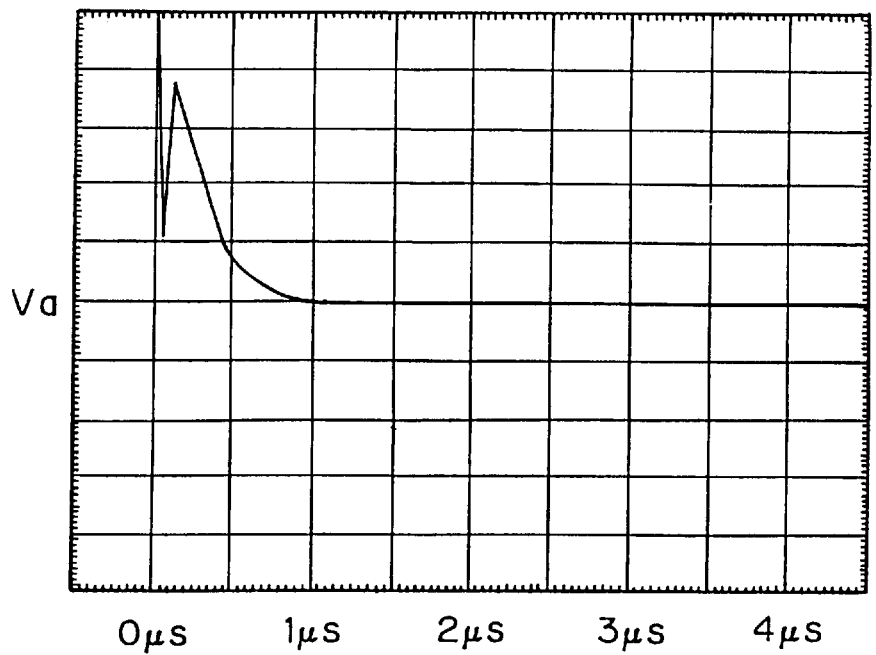
FIG. 4 shows the change in potential at the negative input terminal of an operational amplifier during resetting in the circuit shown in FIG. 3.

As shown in FIG. 4, the time from the start of the resetting operation until stabilization of the potential at the negative input terminal of the operational amplifier D1 in this embodiment falls to less than 1 μs, and in addition, the load applied to operational amplifier D1 increases due to the provision of switch SW6 at the output terminal of operational amplifier D1, and the occurrence of ringing is therefore suppressed.

The circuit constructed according to the foregoing description is used to drive liquid crystal display devices.

While a preferred embodiment of the present invention has been described using specific terms, such description is for illustrative purposes only, and it is to be understood that changes and variations may be made without departing from the spirit or scope of the following claims.

What is claimed is:

1. A driver circuit comprising:
    first and second capacitors to which prescribed voltages are impressed;
    an operational amplifier that executes a predetermined operation and outputs results of said operation when a reference voltage is impressed to one input terminal and said prescribed voltages are impressed to the other input terminal by said first and second capacitors; and
    switching means for isolating said operational amplifier from a function for driving the circuit during a resetting operation,
    wherein said switching means isolates said operational amplifier from the entire circuit.

2. A driver circuit according to claim 1 wherein, when said prescribed voltages are impressed to one input terminal by said first and second capacitors, said operational amplifier executes an operation based on said reference power supply voltage, the capacitances of said first and second capacitors, and voltage impressed to the other input terminal.

3. The driver circuit of claim 1, wherein a resetting time of said resetting operation is set independently of a time necessary for the output of the operational amplifier to stabilize.

4. The driver circuit of claim 1, wherein the resetting operation is performed with the operational amplifier in an isolated state from the entire circuit, thereby allowing a resetting time to be set independently of the time required for stabilization of the output of the operational amplifier.

5. The driver circuit of claim 1, further comprising a third capacitor coupled between a negative input terminal of said operational amplifier and an output terminal of said operational amplifier.

6. A driver circuit comprising:
    first and second capacitors to which prescribed voltages are impressed;
    an operational amplifier that executes a predetermined operation and outputs results of said operation when a reference voltage is impressed to one input terminal and said prescribed voltages are impressed to the other input terminal by said first and second capacitors;
    first and second power supply terminals to which are inputted signals provided with voltages impressed to said operational amplifier;
    a third capacitor connected between the negative input terminal and output terminal of said operational amplifier;
    a first switch provided between said first power supply terminal and said first capacitor;
    a second switch provided between said second power supply terminal and said second capacitor;
    a third switch connecting the side of said first capacitor that is not connected to said operational amplifier with the side of said second capacitor that is not connected to said operational amplifier;
    a fourth switch connecting the side of said second switching that is not connected to said second power supply terminal with the positive input terminal of said operational amplifier,
    a fifth switch connecting provided between said second capacitor and the positive input terminal of said operational amplifier;
    a sixth switch provided between the output terminal of said operational amplifier and said third capacitor; and
    a seventh switch connecting the positive input terminal and output terminal of said operational amplifier.

7. A driver circuit according to claim 6 wherein, when said prescribed voltages are impressed to one input terminal by said first and second capacitors, said operational amplifier executes an operation based on said reference power supply voltage, the capacitances of said first and second capacitors, and voltage impressed to the other input terminal.

8. A drive method of the driver circuit according to claim 7, said method comprising:
    resetting said driver circuit by setting each of said first, second, and sixth switches in an opened state and setting each of said third, fourth, fifth, and seventh switches in a connected state; and
    outputting a desired voltage from said operational amplifier by setting each of said first, second, and sixth switches in a connected state and setting each of said third, fourth, fifth, and seventh switches in an opened state after completing said resetting operation.

9. A drive method of the driver circuit according to claim 6, said drive method comprising:
    resetting said driver circuit by setting each of said first, second, and sixth switches in an opened state and setting each of said third, fourth, fifth, and seventh switches in a connected state; and
    outputting a desired voltage from said operational amplifier by setting each of said first, second, and sixth switches in a connected state and setting each of said third, fourth, fifth, and seventh switches in an opened state after completing said resetting operation.

10. A liquid crystal driving semiconductor device comprising:
    first and second capacitors to which are impressed prescribed voltages for driving a liquid crystal;
    an operational amplifier that carries out a predetermined operation and outputs the results of said operation to said liquid crystal when a reference voltage is impressed to one input terminal and said prescribed voltages are impressed to the other input terminal by said first and second capacitors; and
    switching means for isolating said operational amplifier from a function for driving the circuit during a resetting operation,
    wherein said switching means isolates said operational amplifier from the entire circuit.

11. A liquid crystal driving semiconductor device according to claim 10 wherein, when said prescribed voltages are impressed to one terminal by said first and second capacitors, said operational amplifier executes an operation based on said reference power supply voltage, the capacitances of said first and second capacitors, and the voltage impressed to the other input terminal.

12. A liquid crystal driving semiconductor device comprising:

first and second capacitors to which are impressed prescribed voltages for driving a liquid crystal;

an operational amplifier that carries out a predetermined operation and outputs the results of said operation to said liquid crystal when a reference voltage is impressed to one input terminal and said prescribed voltages are impressed to the other input terminal by said first and second capacitors;

first and second power supply terminals to which are inputted signals provided with the voltages impressed to said operational amplifier;

a third capacitor connected between the negative input terminal and output terminal of said operational amplifier;

a first switch provided between said first power supply terminal and said first capacitor;

a second switch provided between said second power supply terminal and said second capacitor;

a third switch connecting the side of said first capacitor that is not connected to said operational amplifier with the side of said second capacitor that is not connected to said operational amplifier;

a fourth switch connecting the side of said second switching that is not connected to said second power supply terminal with the positive input terminal of said operational amplifier;

a fifth switch provided between said second capacitor and the positive input terminal of said operational amplifier;

a sixth switch provided between the output terminal of said operational amplifier and said third capacitor; and a seventh switch connecting the positive input terminal and output terminal of said operational amplifier.

13. A liquid crystal driving semiconductor device according to claim 12 wherein, when said prescribed voltages are impressed to one terminal by said first and second capacitors, said operational amplifier executes an operation based on said reference power supply voltage, the capacitances of said first and second capacitors, and the voltage impressed to the other input terminal.

14. A drive method of a liquid crystal driving semiconductor device according to claim 13, said method comprising:

resetting said liquid crystal driving semiconductor device by setting each of said first, second, and sixth switches in an opened state and setting each of said third, fourth, fifth, and seventh switches in a connected state; and outputting a desired voltage from said operational amplifier by setting each of said first, second, and sixth switches in a connected state and setting each of said third, fourth, fifth, and seventh switches in an opened state after completing said resetting operation.

15. A drive method of a liquid crystal driving semiconductor device according to claim 13, said method comprising:

resetting said liquid crystal driving semiconductor device by setting each of said first, second, and sixth switches in an opened state and setting each of said first, fourth, fifth, and seventh switches in a connected state; and outputting a desired voltage from said operational amplifier by setting each of said first, second and sixth switches in a connected state and setting each of said third, fourth, fifth, and seventh switches in an opened state after completing said resetting operation.

16. A driver circuit comprising:

first and second capacitors to which prescribed voltages are impressed;

an operational amplifier that executes a predetermined operation and outputs results of said operation when a reference voltage is impressed to one input terminal and said prescribed voltages are impressed to the other input terminal by said first and second capacitors;

a third capacitor coupled between a negative input terminal of said operational amplifier and an output terminal of said operational amplifier; and switching means for isolating said operational amplifier from a function for driving the circuit during a resetting operation, wherein said switching means comprises:

a first switch provided between a first power supply terminal and said first capacitor;

a second switch provided between a second power supply terminal and said second capacitor;

a third switch connecting a side of said first capacitor that is not connected to said operational amplifier with the side of said second capacitor that is not connected to said operational amplifier; and a fourth switch connecting the side of said second switch that is not connected to said second power supply terminal with the positive input terminal of said operational amplifier.

17. The driver circuit of claim 16, wherein said switching means further comprises:

a fifth switch provided between said second capacitor and the positive input terminal of said operational amplifier.

18. The driver circuit of claim 17, wherein said switching means further comprises:

a sixth switch provided between the output terminal of said operational amplifier and said third capacitor.

19. The driver circuit of claim 18, wherein said switching means further comprises:

a seventh switch which connects the positive input terminal and output terminal of said operational amplifier; and an eighth switch coupled between the output terminal of the operational amplifier, through said sixth switch, and to an external load.

* * * * *